US008053824B2

(12) United States Patent
Winn et al.

(10) Patent No.: US 8,053,824 B2
(45) Date of Patent: Nov. 8, 2011

(54) INTERDIGITATED MESH TO PROVIDE DISTRIBUTED, HIGH QUALITY FACTOR CAPACITIVE COUPLING

(75) Inventors: Greg Winn, Fort Collins, CO (US); Steve Howard, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 520 days.

(21) Appl. No.: 11/397,252

(22) Filed: Apr. 3, 2006

(65) Prior Publication Data
US 2007/0228520 A1   Oct. 4, 2007

(51) Int. Cl.
*H01L 27/108* (2006.01)
*H01L 29/94* (2006.01)

(52) U.S. Cl. ........ 257/307; 257/301; 257/302; 257/303; 257/304; 257/305; 257/306; 257/308; 257/309; 257/532; 257/535; 257/758; 257/E27.016; 257/E27.048

(58) Field of Classification Search ................ 257/307, 257/306, 303, 758, 301, 302, 304, 305, 308, 257/309, 532, 535, E27.016, E27.048
See application file for complete search history.

(56) References Cited

U.S. PATENT DOCUMENTS

| 5,208,725 | A | | 5/1993 | Akcasu |
|---|---|---|---|---|
| 5,225,704 | A | | 7/1993 | Wakamiya et al. |
| 5,583,359 | A | | 12/1996 | Ng et al. |
| 5,939,766 | A | * | 8/1999 | Stolmeijer et al. ............. 257/534 |
| 6,819,542 | B2 | * | 11/2004 | Tsai et al. ...................... 361/304 |
| 7,096,732 | B2 | | 8/2006 | Katsumata et al. |
| 7,259,956 | B2 | * | 8/2007 | Fong et al. .................. 361/306.2 |
| 2003/0076197 | A1 | * | 4/2003 | Novak et al. ................... 333/136 |
| 2006/0024905 | A1 | * | 2/2006 | He et al. ......................... 438/396 |
| 2006/0071241 | A1 | * | 4/2006 | Jin ................................. 257/203 |

* cited by examiner

*Primary Examiner* — Matthew E Warren
*Assistant Examiner* — David Chen
(74) *Attorney, Agent, or Firm* — Raj Abhyanker, P.C.

(57) ABSTRACT

Apparatuses and methods for increasing well distributed, high quality-factor on-chip capacitance of integrated circuit devices are disclosed. In one aspect, an integrated circuit device structure includes a first metal line implemented on a metallization layer of a semiconductor substrate, the first metal line having a first set of metal fingers extending therefrom; and a second metal line electrically isolated from the first metal line, the second metal line having a second set of metal fingers extending therefrom, the first set of metal fingers and the second set of metal fingers capacitively coupled. The basic structure of metal lines with interlocking metal fingers may be repeated on multiple adjacent metallization layers, with the metal lines oriented either in parallel or perpendicular.

21 Claims, 9 Drawing Sheets

INTERDIGITATED MESH TO PROVIDE DISTRIBUTED, HIGH QUALITY FACTOR CAPACITIVE COUPLING

FIELD OF TECHNOLOGY

This disclosure relates generally to the technical fields of semiconductor devices, and more particularly to providing increased, distributed, high quality-factor on-chip coupling capacitance.

BACKGROUND

Capacitors are implemented within integrated circuits for a number of reasons, including coupling the power supply voltage line (e.g., bus) and the ground line (bus) to reduce voltage noise by locally meeting charge requirements for current-switching circuits. This capacitive coupling between the power supply voltage line and the ground line is known as supply bypassing. Such on-chip capacitors are typically implemented with active transistors, connected as gate capacitors, and often are implemented wherever there is space on the silicon die, between other functional circuits. That is, due to the placement of circuits, or floorplanning, within the die, there may be some regions where a small number of capacitors may be implemented because there was less need for other circuitry in that area. Conversely, there may be regions where there was no room to implement capacitors.

Gate capacitors have two commonly known issues in their use as effective integrated circuit capacitors. First, the resistance of a salicided poly gate is typically an order of magnitude higher than on-chip metal. This adds a series resistance to the gate capacitor, which reduces the quality-factor of the capacitor, thus reducing the capacitor's effectiveness. Secondly, there is a reliability restriction of connecting gate capacitors with oxide thicknesses of less than 20 Angstroms directly to a power supply line due to gate reliability concerns during an electrostatic discharge (i.e., ESD) event. Gate capacitors with larger oxide thicknesses can be directly connected, but they have much lower capacitance per unit area than gate capacitors with smaller gate thicknesses.

In many instances the physical location of the on-chip capacitors are a relatively large distance from where the stored charge is required. This distance results in a voltage droop due to the impedance of the power line when the capacitor energy is applied to the switching circuit. The higher the frequency of the switching circuit, the more the voltage droop can become, since the stored charge on the voltage line cannot keep up with the re-charge requirements between circuit switches. This voltage droop is a voltage noise on the power line which may cause degradation in circuit performance.

For example, an integrated circuit die may be 10 mm×10 mm, and have the on-chip supply coupling capacitors implemented in only one quadrant of the die, therefore easily being many millimeters from current-switching circuits requiring the capacitive charge.

Typically, integrated circuits provide some inherent capacitance due to the implementation of the metal power mesh (grid). FIG. 1 illustrates an exemplary power mesh of an integrated circuit in accordance with the prior art. As shown in FIG. 1, power mesh 100 shows two metal layers 105 and 110 of an integrated circuit, for example, though a typical power mesh may be comprised of several metallization layers. The layers 105 and 110 are electrically isolated from one another by dielectric layer 115. As shown in FIG. 1, the lower metallization layer includes alternating ground wires 106 (i.e., Vss) and voltage wires 107 (i.e., Vdd) which are shown running horizontally across the lower metallization layer, electrically isolated from each other by dielectric 108.

The upper-metal layer 110, which overlies the lower-metal layer 105, likewise, includes alternating ground wires 111 and voltage wires 112 which are shown running vertically across the upper metallization layer, electrically isolated from each other by dielectric 113. The power mesh 100 provides some inherent capacitance between overlapping voltage and ground wires. That is, wherever the Vdd wire of one metallization layer crosses the Vss wire of the other metallization layer a metal-to-metal capacitor is essentially effected. This capacitance however is not very significant due to the small area of intersection between the Vdd and Vss wires of adjacent metallization layers.

There is some additional coupling capacitance between adjacent Vss wires and Vdd wires on the same metallization layer, but again due to the relatively large distance between the two wires, this coupling capacitance is negligible. Typical application dimensions require an order of magnitude smaller wire spacing to provide substantial coupling capacitance.

Thus, as described above, conventional integrated circuit designs do not provide an adequate amount of well-distributed, high quality-factor coupling capacitance.

SUMMARY

Apparatuses and methods for increasing on-chip, well-distributed, high quality-factor capacitance of integrated circuit devices are disclosed. The apparatus and approach incorporates a three dimensional approach of increasing the lateral and vertical coupling area into an existing power mesh. In one aspect, an integrated circuit device structure includes a first metal line (e.g., a metal bus) implemented on a metallization layer of a semiconductor substrate. The first metal line may have a first set of metal fingers extending therefrom. A second metal line (and/or a metal bus) may be implemented on the same metallization layer. The second metal line may be electrically isolated from the first metal line, the second metal line having a second set of metal fingers extending therefrom, with the first set of metal fingers and the second set of metal fingers capacitively coupled. This capacitance is increased the closer the two sets of metal fingers are placed next to one another, and also increases with increasing metal thickness in the vertical direction.

The first and the second sets of metal fingers may interlock, and may contain a number of metal fingers. The amount of metal used to create the first and the second sets of metal fingers is determined based upon a required grid resistance, desired capacitance, quality factor, and metal density for the metallization layer. The distance between the first and second sets of metal fingers is also dependant on the defect density for the metallization layer. The first metal line may be one voltage node within a circuit, and the second metal line may be a second voltage node within a circuit, thus capacitively coupling the two voltage nodes together. Alternatively, the first metal line may be a ground wire of a power mesh of the integrated circuit device and the second metal line may be a voltage wire of the power mesh. This interlocking pattern of two different voltage nodes may be repeated to many other metallization layers (e.g., thus increasing the overall coupling capacitance in a given area). The first metal line and the second metal line may be any two different voltage nodes of the integrated circuit device.

The structure may include a second metallization layer formed adjacent to (e.g., above or below) the first metallization layer with a dielectric layer disposed between the first metallization layer and the second metallization layer, and a first metal line with corresponding metal fingers and a second metal line with corresponding metal fingers on the second metallization layer, with the first and second metal lines on the second metallization layer in a perpendicular orientation to the first and second metal lines on the first metallization layer, and the first and second sets of metal fingers on the first and second metallization layers in a perpendicular orientation; and a connection through vias between metal lines on the first and second metallization layers that are part of the same voltage node.

A second metallization layer may be formed adjacent to the metallization layer with a dielectric layer disposed between the first metallization layer and the second metallization layer, and a first metal line with corresponding metal fingers and a second metal line with corresponding metal fingers on the second metallization layer, with the first and second metal lines on the second metallization layer in a parallel orientation to the first and second metal lines on the first metallization layer, and the first and second sets of metal fingers on the first and second metallization layers in a parallel orientation; and a connection through vias between metal lines and corresponding sets of metal fingers on the first and second metallization layers that are part of the same voltage node where the lines and fingers are vertically aligned.

In one integrated circuit device, as the metallization layers stack upon one another, each layer would be rotated orthogonal (i.e., 90 degrees) from its preceding layer. This technique allows for current flow in two directions, as would be desired for a power supply mesh.

In another integrated circuit device structure, upper metallization layers may be formed directly above the lower metallization layers, with a dielectric layer disposed between, such that a set of metal fingers extending from a metal line of the upper metallization layer are vertically aligned with corresponding metal fingers from the lower metallization layer. The vertically aligned set of metal fingers extending from a metal line of the upper metallization layer may be physically connected with vias (e.g., electrically coupled) to corresponding metal fingers from the lower metallization layer that are part of the same voltage node.

A further advantage of the invention is the metal shielding that is provided between transistor devices embedded into the silicon substrate below the mesh, and metal routing above the mesh. These techniques can be used in combination. Furthermore, other features will be apparent from the accompanying drawings and from the detailed description that follows.

BRIEF DESCRIPTION OF THE DRAWINGS

Example embodiments of the present invention are illustrated by way of example and not limitation in the figures of the accompanying drawings, in which like references indicate similar elements and in which.

DETAILED DESCRIPTION

Embodiments of the invention disclose capacitive structures effected within an integrated circuit device. In the following description, for purposes of explanation, numerous specific details are set forth in order to provide a thorough understanding of the various embodiments. It will be evident, however, to one skilled in the art that the various embodiments may be practiced without these specific details.

An example embodiment provides methods and systems to form an integrated circuit device structure that includes a first metal line implemented on a metallization layer of a semiconductor substrate, the first metal line having a first set of metallic finger-like protrusions (fingers) extending therefrom; and a second metal line implemented on the same metallization layer, the second metal line electrically isolated from the first metal line, the second metal line having a second set of such metal fingers extending therefrom, the first set of metal fingers and the second set of metal fingers capacitively coupled. The spacing between adjacent metal fingers may be determined in part by the Defect Density for the metal layer. Defect density may be defined as a statistical probability of multiple disconnected pieces of metal inadvertently (e.g., accidentally) being shorted together (e.g., the closer the metal pieces are together, the higher the capacitance, but this may also increase the probability of an inadvertent short).

Example embodiments of a method and a system, as described below, may be used to increase on-chip capacitance of integrated circuit devices. The method further provides well distributed, high quality-factor capacitance between two different voltage potentials. It will be appreciated that the various embodiments discussed herein may not be the same embodiment, and may be grouped into various other embodiments not explicitly disclosed herein.

Figure 1:
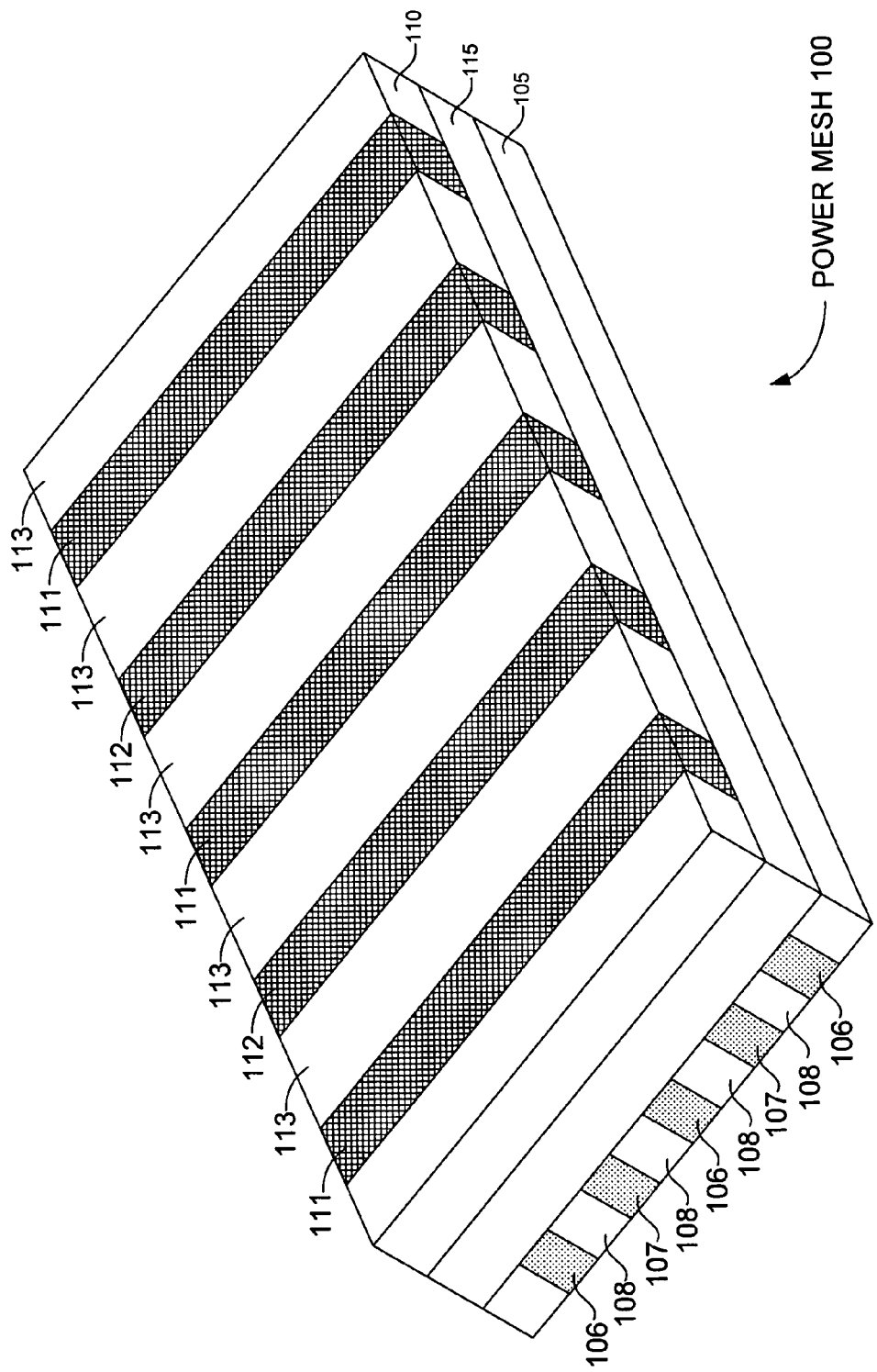
FIG. 1 illustrates an exemplary power mesh of an integrated circuit in accordance with the prior art.
Figure 2A:
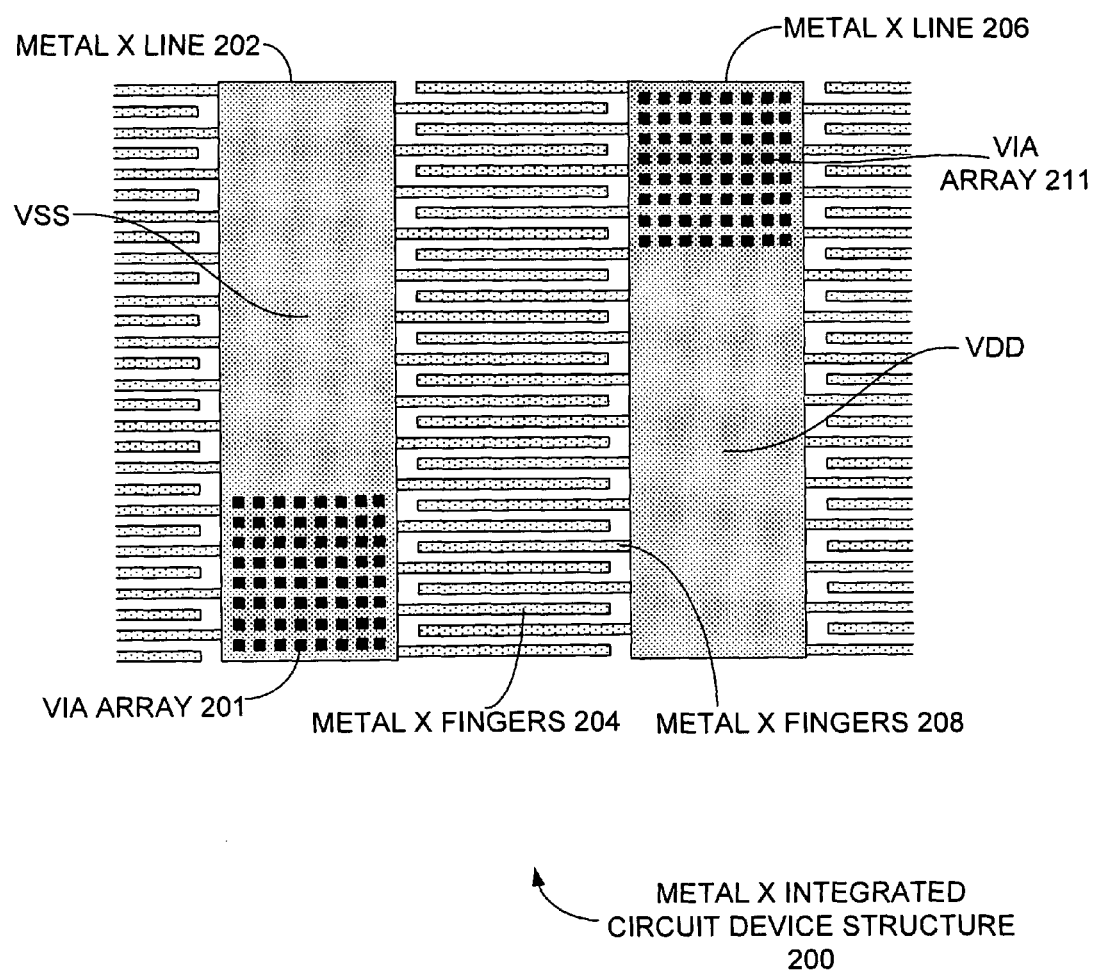
FIG. 2A illustrates a metal X layer in a vertical orientation, in accordance with one embodiment of the invention.

FIG. 2A illustrates a metal X layer in a vertical orientation, in accordance with one embodiment of the invention. In FIG. 2A, a metal layer is illustrated as including vertical metal lines 202 and 206, and metal fingers 204 and 208. Via arrays 201 and 211 connect the metal layer to the metal layers above and/or below. The first metal line 202 may have a number of metal fingers (e.g., metal fingers 204) extending toward the second metal line 206. Likewise, second metal line 206 may have corresponding metal fingers (e.g., metal fingers 208) extending toward the first metal line 202. The second metal line 206 may be electrically isolated from the first metal line 202 (e.g., to prevent a short circuit). The metal lines and fingers described in FIG. 2A may form an integrated circuit device. The first metal line and attached fingers may be at a common ground potential (e.g., Vss), and the second metal line and attached fingers may be at another common voltage potential (e.g., Vdd), however, the metal fingers may be employed between any two nodes at different voltages to increase coupling capacitance.

The integrated circuit device structure in FIG. 2A may act as a capacitor and may store charge between first metal line 202 and metal fingers 204 (e.g. ground bus) and second metal line 206 and metal fingers 208 (e.g., voltage bus). The distance between the first metal line 202 and the second metal line 206 may be based upon the design and manufacturing constraints, for one embodiment the space may be less than 20 microns. The metal fingers 204 of the first line may be at a common potential (e.g., Vss), and the metal fingers 208 of the second line may be at another electrically isolated common potential (e.g., Vdd). As shown in FIG. 2A, the metal fingers 204 connected to the first metal line 202 and the metal fingers 208 connected to the second metal line 206 may interlock and form several capacitors due to combinations between fingers of the two metal lines.

The coupling capacitance generated due to this integrated circuit device may be a sum of the individual capacitances of the interlocking metal fingers. The metal perimeter of each line is greatly increased due to the comb structure formed by the interlocking metal fingers of the two lines, thereby leading to an increase in coupling capacitance. The capacitance varies directly with area of overlap. One embodiment of the invention provides an increase in coupling capacitance of approximately 700% from other approaches. The spacing between the interlocking metal fingers 204 and 208 in FIG. 2A is based upon design and manufacturing constraints. For one embodiment, the space may be less than 1 micron, which gives rise to high capacitive coupling (since capacitance varies inversely to the spacing).

In addition, the metal fingers occupy the regions between the metal lines, thereby increasing the metal density, and replacing areas of dummy metal that would otherwise be present just to attain the required metal density for each metallization layer. This also leads to the formation of a well-distributed coupling capacitance (e.g., a capacitance that is not restricted to certain regions of the chip)

The integrated circuit device structure of FIG. 2A may form a power mesh to distribute power to transistors formed on a semiconductor substrate. The integrated circuit device of FIG. 2A may be present within a given metallization layer (e.g., a metal X layer) oriented along one of the axes (e.g. horizontal axis) of the layer. Multiple such integrated circuit device structures may be arranged within the metallization layer. In addition, similar devices may be present in an adjacent layer (e.g., a metal X+1 layer).

Figure 2B:
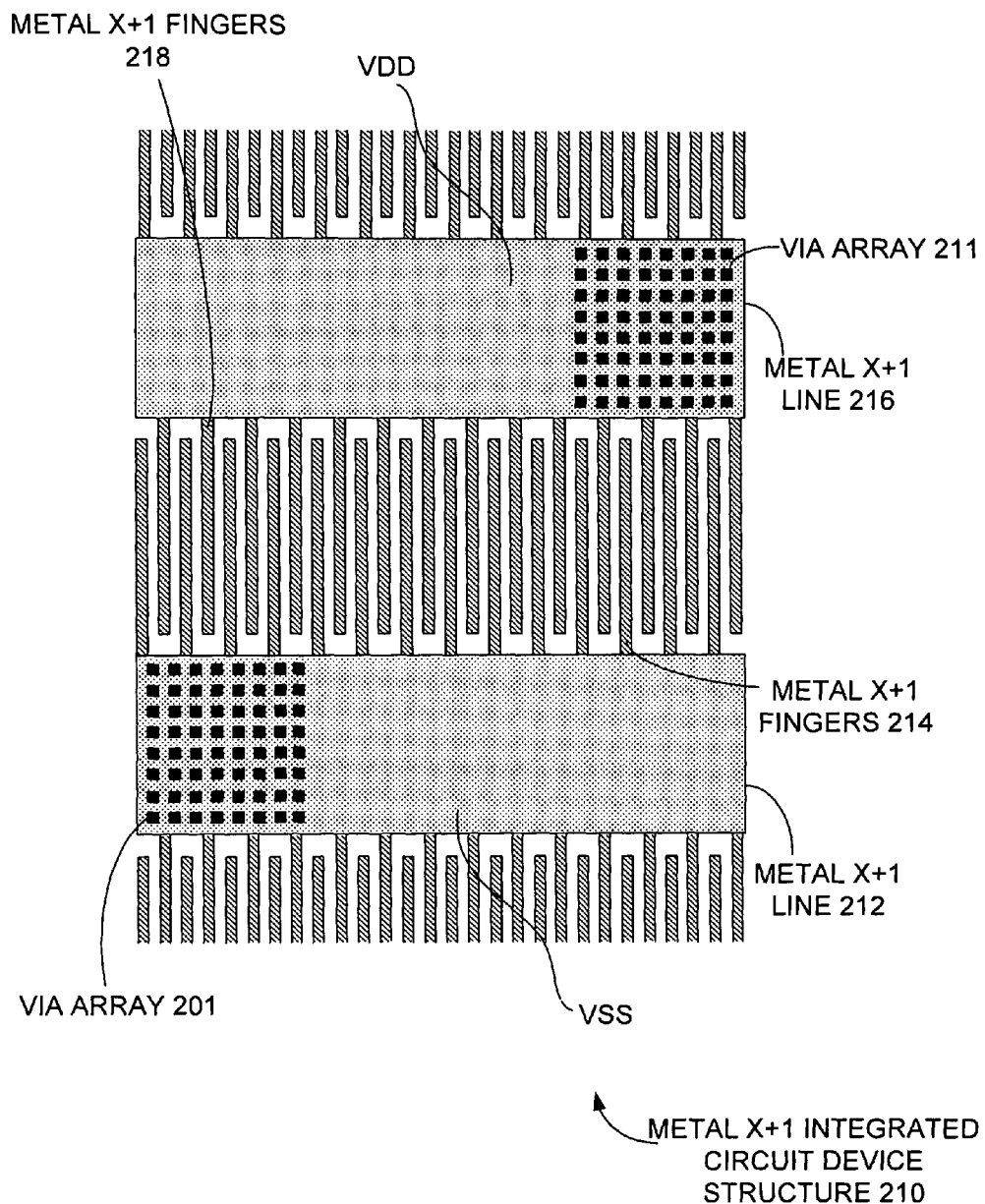
FIG. 2B illustrates a metal X+1 layer in a horizontal orientation, in accordance with one embodiment of the invention.

In one embodiment, an integrated circuit device structure similar to the integrated circuit device structure shown in FIG. 2A may be vertically stacked with a different metallization layer atop or below the integrated circuit device structure of FIG. 2A, such that the power and ground lines of the adjacent stacked layers run perpendicular to each other, and vias may be used to connect the corresponding lines on adjacent layers (e.g., Vdd of metal X to Vdd of metal X+1, and Vss of metal X to Vss of metal X+1). For example, the integrated circuit device structure shown in FIG. 2B is perpendicular to the one shown in FIG. 2A. FIG. 2B illustrates a metal X+1 layer in a horizontal orientation, in accordance with one embodiment of the invention.

Figure 2C:
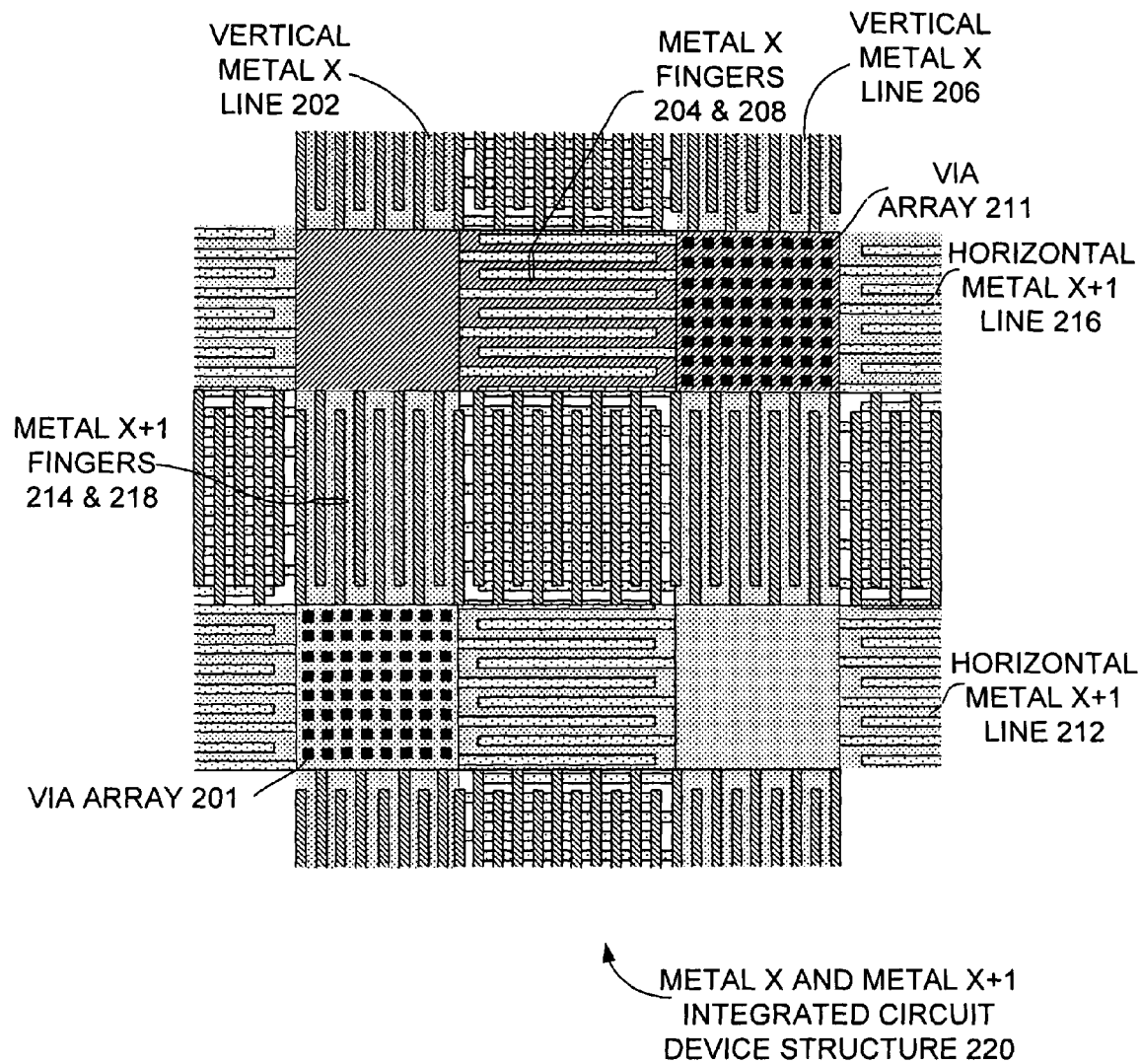
FIG. 2C illustrates the metal X+1 layer in the horizontal orientation stacked on the metal X layer in the vertical orientation, in accordance with one embodiment of the invention.

FIG. 2C illustrates the metal X+1 layer in the horizontal orientation stacked on the metal X layer in the vertical orientation, in accordance with one embodiment of the invention. In FIG. 2C, the metal X and metal X+1 layers are considered to be in a perpendicular, or orthogonal, to one another. Horizontal metal X+1 Vss line 212 is connected to vertical metal X Vss line 202 by via array 201. Horizontal metal X+1 Vdd line 216 is connected to vertical metal X Vdd line 206 by via array 211.

In addition to the capacitances due to the interlocking metal fingers of the lines in the same metallization layer (e.g., metal X to metal X and metal X+1 to metal X+1), there is a capacitance due to the overlap of the metal fingers of adjacent stacked metallization layers (e.g., metal X to metal X+1). In one embodiment, the metal fingers of the first line may be at a common ground potential (e.g., Vss), and the metal fingers of the second line may be at another common voltage potential (e.g., Vdd), however, the metal fingers may be employed between any two nodes at different voltages to increase coupling capacitance.

An embodiment of the invention may be effected within an integrated circuit structure in which the metallization of consecutive stacked layers are oriented the same (e.g., parallel) such that they fully overlap (i.e., the voltage and ground lines from one layer are not perpendicular to the voltage and ground lines of the adjacent layer). In one embodiment of the invention, as illustrated in FIG. 2C, the fingers are orthogonal to each other (e.g., orthogonally aligned in upper and lower layers). Also, in one embodiment, circuitry is shielded under the layers illustrated in FIG. 2C. Also, through the design in FIG. 2C, a better distributed metal density is achieved (e.g., metal density is consistent throughout die, and there are not large areas void of metal).

Figure 3:
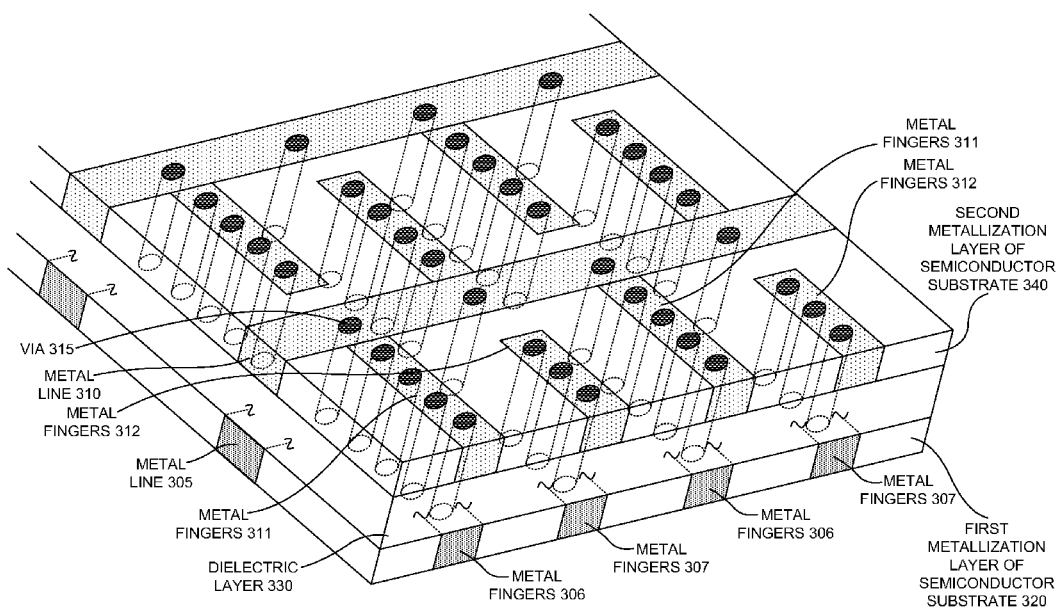
FIG. 3 illustrates an integrated circuit device structure in accordance with one such embodiment of the invention.

FIG. 3 illustrates an integrated circuit device structure in which the metallization of consecutive stacked layers is considered to be parallel, in accordance with one embodiment of the invention. The integrated circuit device structure has a first layer (e.g., metal X+1) aligned on top of a second layer (e.g., metal X) such that they fully overlap (e.g., two integrated circuit devices 200 as shown in FIG. 2A stacked one above the other arranged in the same orientation).

As shown in FIG. 3, the integrated circuit device structure 300 has a first metallization layer of a semiconductor substrate 320 and a second metallization layer of a semiconductor substrate 340 (e.g., metal X and metal X+1). Metallization layer 320 is electrically isolated from metallization layer 340 by dielectric layer 330. Metallization layer 320 has a line 305 implemented thereon. Metallization layer 340 has a line 310 implemented thereon. Line 310 has the same orientation as line 305 and approximately and/or exactly overlaps line 305. (e.g., with the line 310 of the metallization layer 340 approximately and/or exactly above the line 305 of metallization layer 320). For one embodiment of the invention, each of lines 305 and 310 have metal extension shown for example as metal fingers 306 and 311, respectively. For one such embodiment, the metal fingers 311 of line 310 approximately and/or exactly overlap the metal fingers 306 of line 305. For one embodiment of the invention the line 305 implemented on the first metallization layer 320 may be electrically coupled to the line 310 implemented on the second metallization layer 340 with a number of vias, shown for example as via 315. The lines 305 and 310 may form one voltage node, while fingers 307 and 3 12 may be connected together with vias and form part of a second voltage node (for which the bus is not shown in FIG. 3). For one embodiment of the invention, sets of corresponding lines may be implemented on each of several metallization layers. For one such embodiment, the metal fingers of each line extend toward, and interlock with the metal fingers of a corresponding line.

Figure 4A:
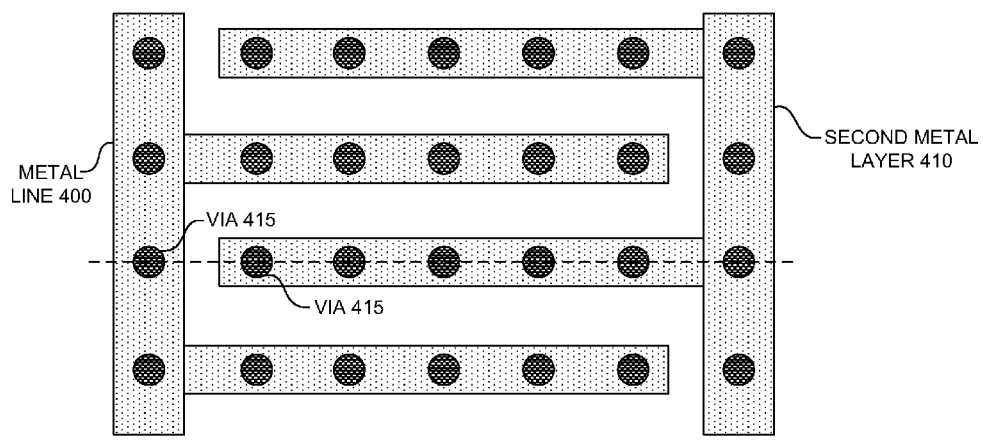
FIG. 4A and FIG. 4B illustrate a cross-section of the capacitor structure shown in FIG. 3 in accordance with one embodiment of the invention.
Figure 4B:
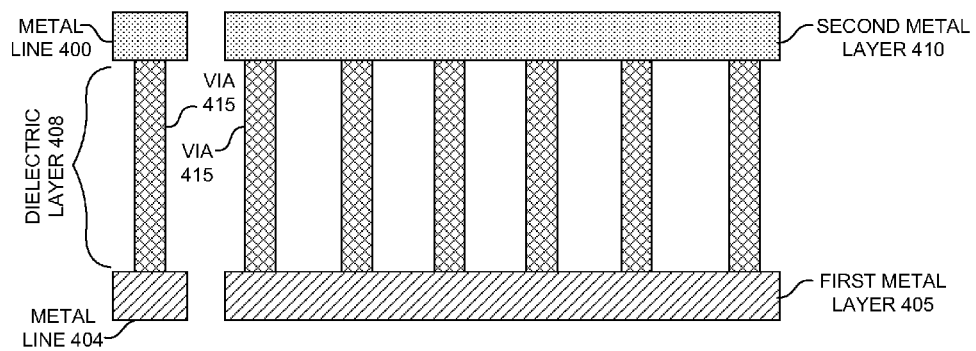

The missing bus from FIG. 3 is shown in the top-level view in FIG. 4A. FIG. 4B illustrates a cross-section of a capacitor structure (e.g. the integrated circuit device structure 300 as shown in FIG. 3) in accordance with one embodiment of the invention. The cross section shows a first metal layer 405 (e.g., metal X) and an adjacent second metal layer 410 (e.g., metal X+1), portions of which are connected with vias 415. The first metal layer 405 and the second metal layer 410 (e.g., metal X and metal X+1) are separated by the dielectric layer 408. The vias 415 may connect the corresponding lines and fingers on adjacent layers (e.g., line 305 to 310, fingers 306 to fingers 311, and fingers 307 to fingers 312 as shown in FIG. 3).

The overlap area between adjacent fingers is increased due to the overlap area of vias that are oriented along another direction (e.g., perpendicular to the metal layers), which may provide a further increase in capacitance. In one embodiment, the buses of two adjacent metal layers may fully overlap (e.g. as shown in FIG. 3). In another embodiment, they may run perpendicular to each other (e.g. as shown in FIG. 2C). In these two embodiments, the overlap areas, and hence the capacitances may be different. Also, for different types of chips, either of the two, or a combination of both (e.g., in multiple metal layers) may be preferred.

In one embodiment, the first and second layers are metal X and metal X+1 layers, however, if the metal layers below are not filled with routing or otherwise utilized, metal layers may be chosen from the lower metal layers (e.g., metal 1 and/or metal 2 and/or metal 3) as well. These layers can also contribute to provide capacitive coupling, and the arrangement shown in FIG. 4 can be extended to multiple metallization layers.

Figure 5:
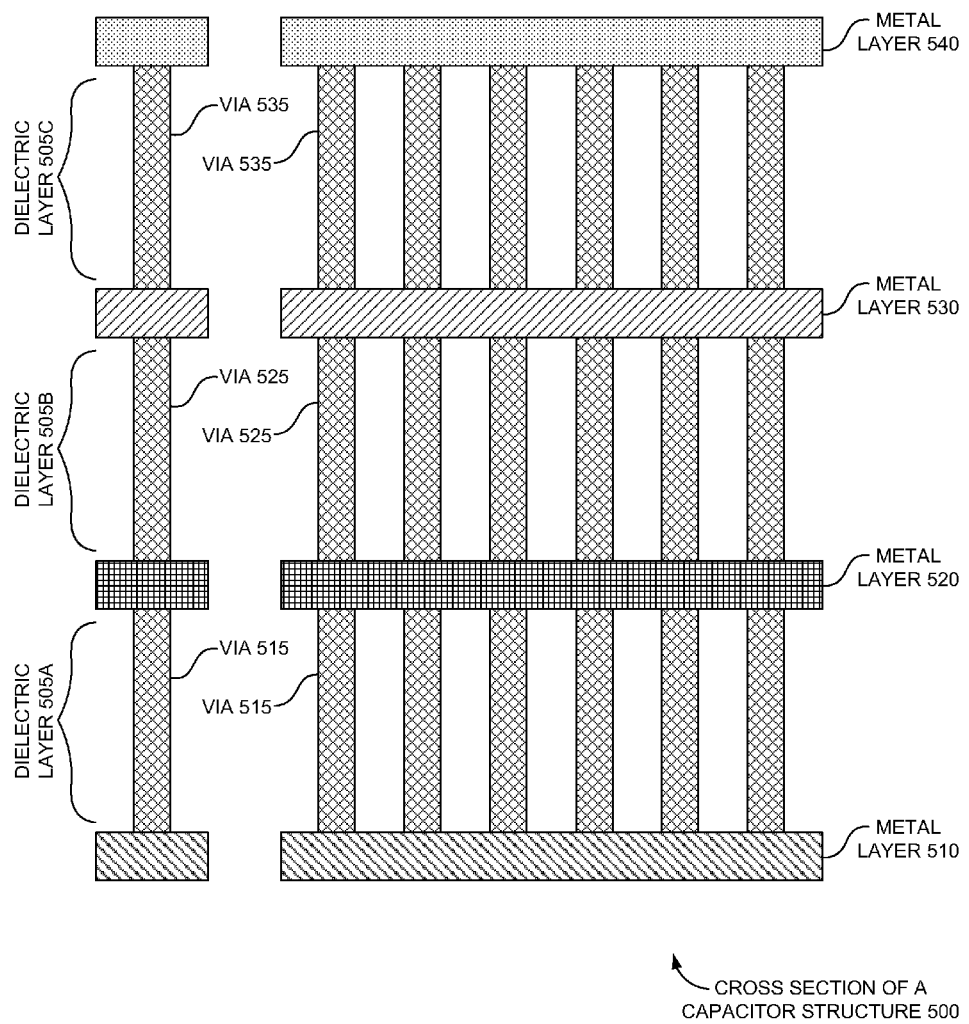
FIG. 5 illustrates such a cross-section of the capacitor structure shown in FIG. 3 implemented over multiple metallization layers in accordance with one embodiment of the invention.

FIG. 5 illustrates such a cross-section 500 of a capacitor structure implemented over multiple metallization layers in accordance with one embodiment of the invention. The cross-section 500 shows four adjacent metal layers, namely layers 510, 520, 530 and 540. As shown in FIG. 5, portions of each of the metal layers are connected with vias to immediately adjacent layers. The adjacent metal layers are separated by dielectric layers 505A-505C disposed between them. As shown in FIG. 5, metal layer 510 is connected to metal layer 520 through a number of vias, shown for example as via 515; metal layer 520 is connected to metal layer 530 through a number of vias, shown for example as via 525; and metal layer 530 is connected to metal layer 540 through a number of vias, shown for example as via 535. For one embodiment of the invention, the vias (e.g., 515, 525, and 535) connect the buses as well as the metal fingers on each adjacent layers. The top-level view of this embodiment is illustrated in the Top View of FIG. 4A.

The metal fingers and the bus lines on multiple metal layers may be oriented in various combinations of horizontal and vertical directions, with the corresponding (e.g., at the same potential) overlapping areas on adjacent layers joined using vias.

All metal layers in a given metal extension (e.g., finger) may be connected with vias, and interlocking metal fingers may be connected to opposite plates of the capacitor (e.g. a metal finger on layer 530 in FIG. 5 may be connected to a capacitor plate at a potential Vdd, and the overlapping metal finger on layer 540 may also be connected to a capacitor plate at a potential Vdd, however the interlocking metal fingers are connected to a capacitor plate at a potential Vss). Thus overlap area is increased both along a given layer, and over various layers (e.g., due to the overlap area of vias).

Figure 6A:
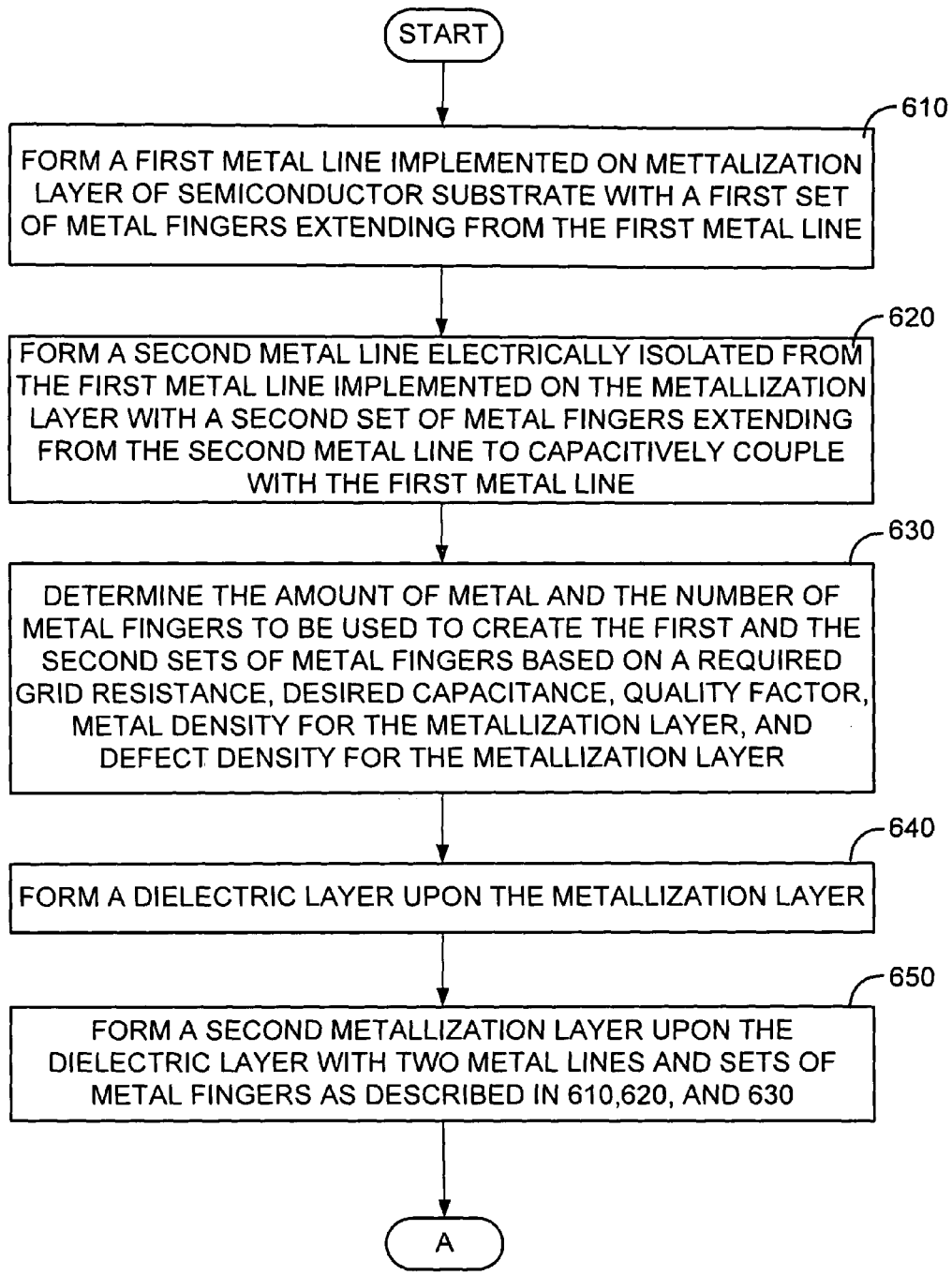
FIG. 6A and FIG. 6B illustrate a process for forming an integrated circuit device in accordance with one embodiment of the invention.
Figure 6B:
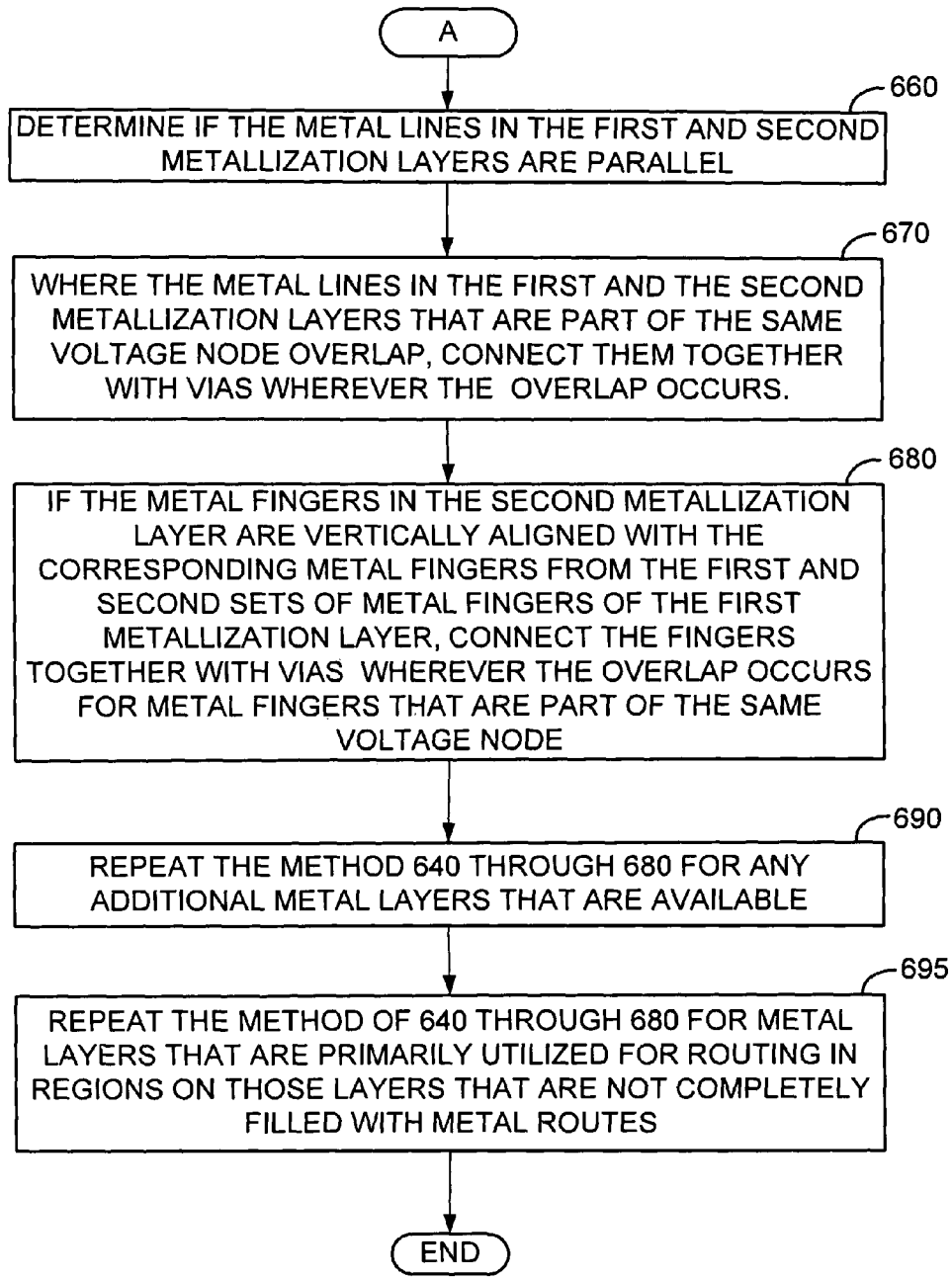

FIG. 6A and FIG. 6B are process flows to form an integrated circuit device, with first and second voltage nodes, each composed of metal buses and metal fingers (e.g., a first voltage node with metal line 202 and fingers 204, and a second voltage node with metal line 206 and fingers 208 of FIG. 2A) implemented on a first metallization layer, and first and second voltage nodes implemented with metal buses and fingers on a second metallization layer (e.g., second metal layer 410 of FIG. 4B) vertically aligned with corresponding metal fingers from the first and second voltage nodes on the first metallization layer, in accordance with one embodiment.

In operation 610, a first metal line (e.g., first metal line 202 of FIG. 2A) to be implemented on a metallization layer (e.g., a first metal layer 405 of FIG. 4B) of a semiconductor substrate is to be formed with a first set of metal fingers (e.g., metal fingers 204 of FIG. 2A) extending from the first metal line. In operation 620, a second metal line (e.g., second metal line 206 of FIG. 2A), electrically isolated from the first metal line (e.g., connected to another plate of a capacitor, at a different potential) to be implemented on a metallization layer (e.g., a first metal layer 405 of FIG. 4B) of a semiconductor substrate is to be formed with a second set of metal fingers (e.g., metal fingers 208 of FIG. 2A) extending from the second metal line.

In operation 630, the amount of metal to be used to create the first and second sets of metal fingers and the number of metal fingers to be used and related parameters (e.g., the metal layer linewidth and the metal layer spacing) is to be determined based upon a required grid resistance, desired capacitance, quality factor, metal density for the metallization layer, and defect density for the metallization layer.

In operation 640, a dielectric layer is formed upon the metallization layer (e.g., the dielectric layer 408 of FIG. 4B), and a second metallization layer is formed upon the dielectric layer in operation 650, such that metal fingers extending from metal lines of the second metallization layer are vertically aligned with corresponding metal fingers from the first and second voltage nodes of the first metallization layer (e.g. as shown in FIG. 3). The vertically aligned corresponding metal fingers of the first and second metallization layers may be connected with vias (e.g., via 315 connecting metal X and metal X+1 fingers 306 and 311 as shown in FIG. 3).

The process as outlined above in FIG. 6 may be carried out for a single metallization layer (e.g. as shown in FIG. 2) and may also be extended to form two or more metallization layers (e.g., as shown in FIG. 4B and FIG. 5). The metal lines (e.g., busses) in adjacent metal layers may be perpendicular. Then the fingers may not be connected with vias, but the lines (busses) are connected with vias when the same lines with the same voltage potential cross.

Particularly, in operation 650, a second metallization layer maybe formed upon the dielectric layer with two metal lines and sets of metal fingers as described in operations 610, 620, and/or 630. Then, as illustrated in FIG. 6B, a determination is made if the metal lines in the first and second metallization layers are parallel in operation 660. If they are, then if the metal lines in the first and the second metallization layers that are part of the same voltage node overlap, they are connected together with vias wherever the overlap occurs in operation 670. Next, if the metal fingers in the second metallization layer are vertically aligned with the corresponding metal fingers from the first and second sets of metal fingers of the first metallization layer, the fingers are connected together with vias wherever the overlap occurs for metal fingers that are part of the same voltage node in operation 680. The operations 650 through 680 are repeated for any additional metal layers that are available in operation 690. Then the method/operations of 650 through 690 for metal layers that are primarily utilized for routing in regions on those layers that are not completely filled with metal routes are repeated.

Although the present embodiment has been described with reference to specific example embodiments, it will be evident that various modifications and changes may be made to these embodiments without departing from the broader spirit and scope of the invention. In addition, it will be appreciated that the various operations, processes, and methods disclosed herein may be embodied in a machine-readable medium and/or a machine accessible medium compatible with a data processing system (e.g., a computer system). Accordingly, the specification and drawings are to be regarded in an illustrative rather than a restrictive sense.

What is claimed is:

1. An integrated circuit device structure comprising:
   a first metal line implemented on a metallization layer of a semiconductor substrate, the first metal line having a first set of metal fingers extending therefrom, the first metal line being significantly thicker along a direction of extension of the first set of metal fingers than each of the first set of metal fingers along a direction perpendicular to the extension thereof;
   a second metal line implemented on the metallization layer, the second metal line being electrically isolated from the first metal line, the second metal line having a second set of metal fingers extending therefrom, the first set of metal fingers and the second set of metal fingers being capacitively coupled, and the second metal line also being significantly thicker along a direction of extension of the second set of metal fingers than each of the second set of metal fingers along a direction perpendicular to the extension thereof; and
   a via array provided respectively on the first metal line and the second metal line to enable coupling of the metallization layer to another metallization layer in a direction perpendicular to a plane including the first metal line, wherein the via array is only at one end portion of the first metal line and the second metal line, respectively, the first set of metal fingers, the second metal line and the second set of metal fingers.

2. The structure of claim 1, wherein the first metal line is a ground wire of a power mesh of an integrated circuit device and the second metal line is a voltage wire of the power mesh.

3. The structure of claim 1, wherein the first metal line and the second metal line are configured to operate as two different voltage nodes of an integrated circuit device.

4. The structure of claim 1, wherein a distance between the first metal line and the second metal line is approximately 5 microns.

5. The structure of claim 1, wherein a metal finger of the first set of metal fingers is approximately 0.5 microns from a corresponding metal finger of the second set of metal fingers.

6. The structure of claim 1, wherein the first set of metal fingers and the second set of metal fingers include a number of metal fingers determined based upon a required grid resistance, desired capacitance, quality factor, metal density for the metallization layer, and defect density for the metallization layer.

7. The structure of claim 1, further comprising:
   a second metallization layer formed adjacent to the first metallization layer with a dielectric layer disposed between the first metallization layer and the second metallization layer; and
   a first metal line with corresponding metal fingers and a second metal line with corresponding metal fingers on the second metallization layer, with the first and second metal lines on the second metallization layer in a perpendicular orientation to the first and second metal lines on the first metallization layer, and the first and second sets of metal fingers on the first and second metallization layers in a perpendicular orientation,
   wherein the first metallization layer and the second metallization layer are coupled through the via array.

8. A method comprising:
   forming a first metal line implemented on a first metallization layer of a semiconductor substrate, the first metal line having a first set of metal fingers extending therefrom, the first metal line being significantly thicker along a direction of extension of the first set of metal fingers than each of the first set of metal fingers along a direction perpendicular to the extension thereof;
   forming a second metal line implemented on the metallization layer, the second metal line being electrically isolated from the first metal line, the second metal line having a second set of metal fingers extending therefrom, the first set of metal fingers and the second set of metal fingers being capacitively coupled, and the second metal line also being significantly thicker along a direction of extension of the second set of metal fingers than each of the second set of metal fingers along a direction perpendicular to the extension thereof; and
   providing a via array respectively on the first metal line and the second metal line, wherein the via array is only at one end portion of the first metal line and the second metal line, respectively, to enable coupling of the metallization layer to another metallization layer in a direction perpendicular to a plane including the first metal line, the first set of metal fingers, the second metal line and the second set of metal fingers.

9. The method of claim 8, wherein the first metal line is a ground wire of a power mesh of an integrated circuit device and the second metal line is a voltage wire of the power mesh.

10. The method of claim 8, wherein the first metal line and the second metal line are configured to operate as two different voltage nodes of an integrated circuit device.

11. The method of claim 8, wherein the first set of metal fingers and the second set of metal fingers interlock.

12. The method of claim 8, wherein a distance between the first metal line and the second metal line is approximately 5 microns.

13. The method of claim 8, wherein a metal finger of the first set of metal fingers is approximately 0.5 microns from a corresponding metal finger of the second set of metal fingers.

14. The method of claim 8, wherein the first set of metal fingers and the second set of metal fingers include a number of metal fingers determined based upon a required grid resistance, desired capacitance, quality factor, metal density for the metallization layer, and defect density for the metallization layer.

15. The method of claim 8, further comprising:
   forming a second metallization layer adjacent to the first metallization layer with a dielectric layer disposed between the first metallization layer and the second metallization layer; and
   forming a first metal line with corresponding metal fingers and a second metal line with corresponding metal fingers on the second metallization layer, with the first and second metal lines on the second metallization layer in a perpendicular orientation to the first and second metal lines on the first metallization layer, and the first and second sets of metal fingers on the first and second metallization layers in a perpendicular orientation; and
   coupling the first metallization layer and the second metallization layer through the via array.

16. An integrated circuit device comprising:
   a semiconductor substrate having formed thereon a plurality of transistors; and
   a power mesh for distributing power to the transistors, the power mesh including a plurality of first metal lines that are ground wires and a plurality of second metal lines that are voltage wires alternately formed on a metallization layer of the semiconductor substrate, each ground wire and each voltage wire being electrically isolated, each ground wire having a first set of metal fingers extending therefrom and each voltage wire having a second set metal fingers extending therefrom, each of the plurality of first metal lines being significantly thicker along a direction of extension of the first set of metal fingers than each of the first set of metal fingers along a direction perpendicular to the extension thereof, each of the plurality of second metal lines also being significantly thicker along a direction of extension of the second set of metal fingers than each of the second set of metal fingers along a direction perpendicular to the extension thereof, the first set of metal fingers and the second set of metal fingers being capacitively coupled, thereby increasing the bypass capacitance of the power mesh, and the power mesh further comprising a via array provided respectively on each of the plurality of first metal lines and each of the plurality of second metal lines, wherein the via array is only at one end portion of each of the plurality of first metal lines and each of the plurality of second metal lines, respectively, to enable coupling of the metallization layer to another metallization layer in a direction perpendicular to a plane including the plurality of first metal lines, the first set of metal fingers, the plurality of second metal lines and the second set of metal fingers.

17. The integrated circuit device of claim 16, wherein the first set of metal fingers and the second set of metal fingers interlock.

18. The integrated circuit device of claim 16, wherein a distance between the each of the plurality of first metal lines and each of the plurality of second metal lines is approximately 5 microns.

19. The integrated circuit device of claim 18, wherein a metal finger of the first set of metal fingers is approximately 0.5 microns from a corresponding metal finger of the second set of metal fingers.

20. The integrated circuit device of claim 16, wherein the first set of metal fingers and the second set of metal fingers include a number of metal fingers determined based upon a required grid resistance, desired capacitance, quality factor, metal density for the metallization layer, and defect density for the metallization layer.

21. The integrated circuit device of claim 16, further comprising:
- a second metallization layer formed adjacent to the first metallization layer with a dielectric layer disposed between the first metallization layer and the second metallization layer; and
- a first metal line with corresponding metal fingers and a second metal line with corresponding metal fingers on the second metallization layer, with the first and second metal lines on the second metallization layer in a perpendicular orientation to the first and second metal lines on the first metallization layer, and the first and second sets of metal fingers on the first and second metallization layers in a perpendicular orientation,
- wherein the first metallization layer and the second metallization layer are coupled through the via array.

* * * * *